(12) United States Patent
Kuwabara

(10) Patent No.: US 7,319,236 B2
(45) Date of Patent: Jan. 15, 2008

(54) SEMICONDUCTOR DEVICE AND ELECTRONIC DEVICE

(75) Inventor: Hideaki Kuwabara, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 204 days.

(21) Appl. No.: 11/115,155

(22) Filed: Apr. 27, 2005

(65) Prior Publication Data

US 2005/0258423 A1    Nov. 24, 2005

(30) Foreign Application Priority Data

May 21, 2004    (JP)    ............... 2004-152433

(51) Int. Cl.
  *H01L 29/04*    (2006.01)
  *H01L 31/036*    (2006.01)
  *H01L 31/0376*    (2006.01)
  *H01L 31/20*    (2006.01)

(52) U.S. Cl. ............... 257/59; 257/66; 257/72; 257/347

(58) Field of Classification Search ................. 257/59, 257/66, 71, 72, 347
See application file for complete search history.

(56) References Cited

U.S. PATENT DOCUMENTS

| | | | |
|---|---|---|---|
| 4,394,182 A | 7/1983 | Maddox, III | |
| 4,851,363 A | 7/1989 | Troxell et al. | |
| 5,583,369 A | 12/1996 | Yamazaki et al. | |
| 5,696,386 A | 12/1997 | Yamazaki | |
| 5,736,750 A | 4/1998 | Yamazaki et al. | |
| 5,892,562 A | 4/1999 | Yamazaki et al. | |
| 5,946,561 A | 8/1999 | Yamazaki et al. | |
| 6,365,917 B1 | 4/2002 | Yamazaki | |
| 6,498,634 B1 | 12/2002 | Yamazaki et al. | |
| 6,515,336 B1 | 2/2003 | Suzawa et al. | |
| 6,534,826 B2 | 3/2003 | Yamazaki | |
| 6,541,294 B1 | 4/2003 | Yamazaki et al. | |
| 6,664,145 B1 | 12/2003 | Yamazaki et al. | |
| 6,743,649 B2 | 6/2004 | Yamazaki et al. | |
| 6,753,257 B2 | 6/2004 | Yamazaki | |
| 6,914,655 B2 | 7/2005 | Yamazaki et al. | |
| 2004/0174485 A1 | 9/2004 | Yamazaki et al. | |
| 2004/0264246 A1* | 12/2004 | Sakui et al. ............ | 365/185.01 |
| 2005/0243257 A1 | 11/2005 | Yamazaki et al. | |

FOREIGN PATENT DOCUMENTS

| | | |
|---|---|---|
| JP | 4-212428 | 8/1992 |
| JP | 5-211170 | 8/1993 |
| JP | 2000-68515 | 3/2000 |
| JP | 2003-282881 | 10/2003 |

* cited by examiner

*Primary Examiner*—Thien F Tran
(74) *Attorney, Agent, or Firm*—Nixon Peabody LLP; Jeffrey L. Costellia

(57) ABSTRACT

It is an object to provide technique for forming a further minute gate electrode in a semiconductor integrated circuit. According to the present invention, a conductive film is etched while a resist mask is made to recede so as to make a cross section of a gate wiring have a trapezoidal shape having a width capable of being electrically connected to an upper layer wiring and make a cross section of a gate electrode, which diverges from a gate wiring, have a shape comprising only three interior angles, typically a triangular shape; and thus, a gate width of 1 µm or less is realized. According to the invention, increase of ON current is realized and a circuit operating at high speed (typically, a CMOS circuit or an NMOS circuit) can be obtained.

24 Claims, 12 Drawing Sheets

SEMICONDUCTOR DEVICE AND ELECTRONIC DEVICE

BACKGROUND OF THE INVENTION

1. Field of the Invention

The present invention relates to a semiconductor device having a circuit constituted by thin film transistors (referred to as TFTs) and method for manufacturing thereof. For example, the invention relates to an electronic device on which an electro-optical device typified by a liquid crystal display panel or a light emitting display device having an organic light emitting element is mounted as a component.

Further, in this specification, a semiconductor device means overall devices which can function by utilizing a semiconductor characteristic, and an electro-optical device, a semiconductor circuit, and an electronic device are all included in the semiconductor device.

2. Description of the Related Art

In recent years, technique for forming a thin film transistor (TFT) using a semiconductor thin film (having a thickness of approximately from several to several hundreds nm), which is formed over a substrate having an insulating surface, has attracted attention. A thin film transistor is applied broadly to electronic devices such as an IC or an electro-optical device, and has been rushed to be developed especially as a switching element of an image display device.

Especially, an active matrix liquid crystal display device provided with a switching element formed from a TFT in every display pixel placed in a matrix is actively developed.

In an active matrix liquid crystal display device, development of enlarging an effective screen area in a pixel region is promoted. To enlarge an effective screen area, an area occupied by a TFT (pixel TFT) placed in the pixel portion has to be made as small as possible. Furthermore, development of forming a driver circuit and a pixel portion over the same substrate is also promoted so as to reduce a manufacturing cost.

In a liquid crystal module mounted on a liquid crystal display device, a pixel portion which displays image, and a driver circuit for controlling the pixel portion, comprising a shift register circuit, a level shifter circuit, a buffer circuit, and a sampling circuit, each of which is based on a CMOS circuit, are formed over one substrate.

In the case of forming a driver circuit and a pixel portion over the same substrate, an area occupied by a region other than a pixel region, which is referred to as a frame portion, tends to be larger compared to that in the case of mounting a driver circuit by a TAB method. To reduce an area of the frame portion, the size of a circuit constituting a driver circuit also has to be reduced.

A pixel TFT is formed of an n-channel TFT and drives a liquid crystal by being applied voltage as a switching element. A pixel TFT of a liquid crystal display device is driven by an alternating current; therefore, a method referred to as frame inversion driving is often used. In this method, it is important for a characteristic required for a pixel TFT to sufficiently lower an OFF current value (a drain current flowing when a TFT is in OFF operation) in order to reduce power consumption.

Further, some techniques for making a line width of a gate electrode minute so as to reduce a transistor size are proposed.

For example, in Reference 1, technique of using a metal sidewall deposited on a side wall of a stepped portion as a gate is mentioned (Reference 1: Japanese Patent Laid-Open No. H4-212428).

In Reference 2, a thin film transistor (TFT) having a gate electrode having a sidewall shape is proposed (Reference 2: Japanese Patent Laid-Open No. 2003-282881).

The gate electrode having a sidewall shape mentioned in the above Reference 1 or Reference 2 is easy to have variation in its shape and thickness. Further, it is difficult to be electrically connected to the gate electrode having the sidewall shape of References 1 and 2 when employing a method for forming a normal contact hole, so it is required that the gate electrode is directly and electrically connected by overlapping a wiring formed from a conductive material different from that of the gate electrode. Therefore, contact resistance increases due to an influence of contact resistance between dissimilar metal. In addition, in the above Reference 1 or Reference 2, many steps (film formation step must be performed at least two times) are required to form a gate electrode and a gate wiring. In addition, a step for forming a step to form a sidewall is also required according to References 1 and 2.

Furthermore, in the TFT mentioned in Reference 2, a semiconductor layer is placed so as to straddle a stepped portion; therefore, it is difficult to obtain a semiconductor layer having uniform crystallinity in a crystallization step.

A channel width of a TFT is dependent on the width of a gate wiring in a conventional TFT, therefore, it is difficult to increase ON current of the TFT in case a channel length is long due to a wide gate wiring. Further, a channel length of a TFT cannot be shortened; therefore, gate capacitance is hard to be reduced and an integrated circuit including a TFT is prevented from operating at high speed.

SUMMARY OF THE INVENTION

It is an object of the present invention to provide a semiconductor device provided with a TFT having a minute channel length by making a line width of a gate electrode minute through comparatively small number of steps and a method for manufacturing the same.

One feature of the invention is that a cross section of a wiring in a TFT is purposely made to have a shape comprising only three interior angles, typically a triangular shape, in order to make a line width of a wiring minute. A conductive film is etched while a resist mask is made to recede to form an electrode having a triangular shape in its cross section. The resist mask has disappeared by the time the electrode having a triangular shape is formed by etching; and thus, a step for removing a resist can be omitted. In this specification, a cross-sectional shape means a cross-sectional shape taken along a perpendicular surface to a principal plane of a substrate.

Further, in this specification, a triangle means a figure including line segments which connect each of three points which are not in alignment and comprising only three interior angles. For example, an isosceles triangle as shown in FIG. 13A, a right triangle as shown in FIG. 13B, a regular triangle, an acute triangle, or an obtuse triangle can be given. Further, in this specification, a triangular shape includes a triangular shape in which two sides other than a base are curved as shown in FIG. 13C. Besides, in this specification, a triangle also includes a triangle with around angles in some extend and a trapezoid whose lower side is at least ten times as long as the upper side.

An embodiment of the invention disclosed in this specification is a semiconductor device provided with a plurality of TFTs each including a semiconductor layer formed over an insulating surface, an insulating film formed over the semiconductor layer, and a gate electrode formed over the insulating film, wherein the semiconductor layer includes a channel formation region overlapped with the gate electrode, a low-concentration impurity region partly overlapped with the gate electrode, and a source region and a drain region formed of a high-concentration impurity region, and wherein a part of the gate electrode overlapped with the channel formation region has a cross-sectional shape comprising only three interior angles.

Specifically, a TFT having a short channel length is realized by making a gate electrode of a TFT minute to 1 μm or less to have a shape comprising only three interior angles, typically, a triangular shape. According to the invention, increase of ON current (because of a shortening a channel length or a reducing parasitic capacitance) or reduction in gate capacitance (because of a shortening a channel length) is realized, and a circuit operating at high speed (typically, a CMOS circuit or an NMOS circuit) can be obtained.

Some of TFTs in a semiconductor integrated circuit (a CPU, a memory, or the like) which requires high speed driving, operation at high speed may be attained by forming a gate electrode to have a triangular shape. Further, in a display device, outside light from an upper side of a TFT can be scattered with prevention of specular reflection by forming a gate electrode of a TFT which serves as a switching element to have a triangular shape.

Another embodiment of the invention is a semiconductor device provided with a plurality of TFTs each including a semiconductor layer formed over an insulating surface, an insulating film formed over the semiconductor layer, and a gate electrode formed over the insulating film, wherein a part of the gate electrode overlapped with the semiconductor layer has a cross sectional shape comprising only three interior angles, and wherein a gate wiring formed to be connected to the gate electrode has a cross section of a trapezoidal shape.

Only a part of a gate electrode overlapped with a semiconductor layer and the periphery thereof may be a triangular shape, and a cross section of an extended gate wiring may have a trapezoidal shape by adjusting a width of a resist mask and etching conditions. A minute gate electrode (a triangular shape) can be obtained without increasing the number of steps, and a gate wiring (a trapezoidal shape) can be electrically connected to a wiring in the upper layer. In addition, a wiring having low resistance is realized since the gate wiring is made to be minute, not wholly but partially.

Disconnection is likely to happen in the case of using a minute wiring having a line width of 1 μm or less. By forming the edge portion of a wiring to be thick, the amount of etching becomes uniform. Further, a wiring having a triangular shape is preferably formed over an even surface since disconnection is likely to happen when there is a step in a base film. Therefore, a gate wiring over a portion where there is a step in a base film may have a trapezoidal shape and only a gate wiring over an even portion may have a triangular shape.

In the above embodiment, one feature is that a largest film thickness of the gate electrode or gate wiring having a cross section of a triangular shape is the same as that having a cross section of a trapezoidal shape. A width of a resist mask and etching condition may be adjusted so that a film thickness of a portion where a cross section of the gate electrode or gate wiring has a triangular shape is the same as a film thickness of a portion where a cross section has a trapezoidal shape to prevent disconnection in the case of a minute wiring having a line width of 1 μm or less.

Furthermore, a film thickness in a portion having a triangular shape (corresponding to the height of a triangle) and a film thickness in a portion having a trapezoidal shape (corresponding to the height of a trapezoid) can be varied. In the above embodiment, another feature is that a film thickness of the gate electrode or gate wiring having a cross section of a triangular shape is thinner than that having a cross section of a trapezoidal shape. A film thickness of the gate electrode or gate wiring having a triangular shape can be made thinner than that having a trapezoidal shape by etching a plurality of times. Favorable coverage can be obtained by thinning a film thickness of the gate electrode or gate wiring having a triangular shape than that having a trapezoidal shape.

A material including a refractory metal in which a few hillocks are generated is preferably used as a material of the gate electrode. One kind selected from W, Mo, Ti, Ta, Co, and the like or an alloy thereof is used as the refractory metal in which a hillock generates less. In addition, it is preferable to form a structure in which a nitride film (nitride metal film, nitride silicon film, or the like) surrounds the gate electrode in order to prevent a minute wiring from stripping from a base film. Further, in the above structure, one feature is that a side surface and a lower surface of the gate electrode is surrounded by a nitride silicon film.

In the above structure, one feature is that a channel length of the TFT is from 0.1 μm to 1 μm.

In the above structure, one feature is that the gate electrode diverges from a gate wiring, and a width of the gate wiring is wider than a width of the gate electrode.

In the case of a double gate structure having two channel formation regions by placing two gate electrodes in parallel over a plane, it is difficult to narrow a distance between the gate electrodes, and defective coverage is easy to be generated. Therefore, after obtaining a wiring having a trapezoidal shape by first etching with the use of a first mask, a second resist mask is formed, and the wiring is processed and divided by second etching so as to have a triangular shape to form a plurality of gate electrodes. In addition, a multi gate structure having three or more channel formation regions may be used.

Moreover, another embodiment of the invention is a semiconductor device provided with a plurality of TFTs each including a semiconductor layer formed over an insulating surface, an insulating film formed over the semiconductor layer, and a gate electrode formed over the insulating film, wherein the semiconductor layer has a plurality of channel formation regions overlapped with the gate electrode, wherein a plurality of gate electrodes overlapped with the semiconductor layer has a cross sectional shape comprising only three interior angles, and wherein a gate wiring formed to be connected to the gate electrode has a cross section having a trapezoidal shape.

According to the invention, increase of ON current (because of a shortening a channel length or a reducing parasitic capacitance) or reduction in gate capacitance (because of a shortening a channel length) is realized, and a circuit operating at high speed (typically, a CMOS circuit or an NMOS circuit) can be obtained.

These and other objects, features and advantages of the present invention will become more apparent upon reading of the following detailed description along with the accompanied drawings.

DETAILED DESCRIPTION OF THE INVENTION

Figure 1A:
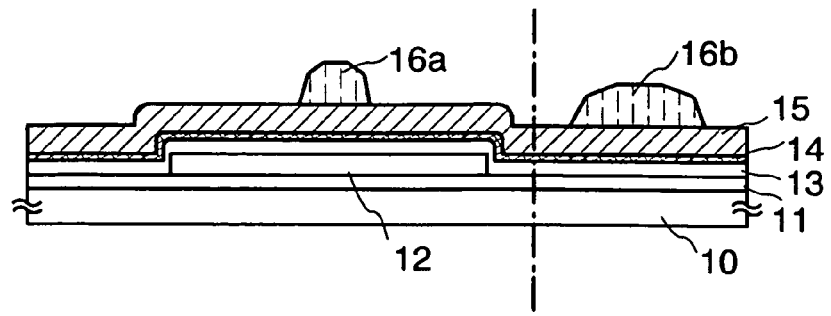
FIGS. 1A to 1D are cross-sectional views of steps, which show Embodiment Mode 1.

Embodiment modes according to the present invention are described in detail with reference to the drawings. It is easily understood by those who are skilled in the art that embodiments and details herein disclosed can be modified in various ways without departing from the purpose and the scope of the invention. Therefore, it should be noted that the description of embodiment modes to be given below should not be interpreted as limiting the invention. Further, in constitutions according to the invention to be described below, similar parts among different drawings are marked in common with the same reference numerals. Hereinafter, Embodiment Mode of the invention is described.

Embodiment Mode 1

FIGS. 1A to 1D show cross-sectional views of manufacturing steps of a semiconductor device of the present invention. Here, an example of simultaneously forming a wiring having a triangular shape only in a location where it is required to be minute and a wiring having a trapezoidal shape in another location is shown.

First, as shown in FIG. 1A, a base insulating film 11 formed of an insulating film such as a silicon oxide film, a silicon nitride film, or a silicon oxynitride film ($SiO_xN_y$) is formed over a substrate 10 having an insulating surface. In a representative example, the base insulating film 11 has a two layer structure, for which a silicon nitride oxide film having a thickness of from 50 nm to 100 nm formed using $SiH_4$, $NH_3$, and $N_2O$ as reactive gases and a silicon oxynitride film having a thickness of from 100 nm to 150 nm formed using $SiH_4$ and $N_2O$ as reactive gases are stacked. In addition, a silicon nitride film (SiN film) or a silicon oxynitride film ($SiN_xO_y$ film (X>Y)) having a film thickness of 10 nm or less is preferably used as one layer of the base insulating film 11.

Then, a semiconductor film having an amorphous structure is formed over the base insulating film 11. A semiconductor material containing silicon as its main component is used as the semiconductor film. Typically, an amorphous silicon film, an amorphous silicon germanium film, or the like is formed using a known means (a sputtering method, an LPCVD method, a plasma CVD method, or the like), and then, known crystallization treatment (a laser crystallization method, a thermal crystallization method, a thermal crystallization method using a catalyst such as nickel, or the like) is performed to obtain a semiconductor film having a crystalline structure.

Alternatively, when a film formation condition is adjusted appropriately, a semiconductor film having a crystalline structure (for example, a polycrystalline silicon film, a microcrystalline semiconductor film (also referred to as a semi-amorphous semiconductor film)) may be obtained by only performing film formation. For example, a semiconductor film including a crystalline structure is directly formed over a substrate to be treated by introducing a silicide gas (monosilane, disilane, trisilane, or the like) and fluorine (or a halogen fluoride gas) into a deposition chamber as material gases to generate plasma.

Next, patterning is performed with the use of photolithography technique to obtain a semiconductor layer 12. Before forming a resist mask in the patterning, an oxide film is formed by using ozone-containing solution or generating ozone by UV irradiation in an oxygen atmosphere so as to protect the semiconductor layer. The oxide film here has also an effect in improving wettability of the resist.

If necessary, before the patterning, doping with a slight amount of impurity elements (boron or phosphorous) is performed through the above oxide film in order to control the threshold value of a TFT. When the doping is performed through the above oxide film, the oxide film is removed, and then another oxide film is formed using ozone-containing solution.

Then, after cleaning is performed to remove an undesired substance generated during the patterning (a remaining resist, a solution for stripping a resist, and the like), an insulating film containing silicon as its main component, which is to be a gate insulating film 13, is formed. A single layer of an insulating film such as a silicon oxide film, a silicon nitride film, or a silicon oxynitride film ($SiO_xN_y$), or a lamination layer thereof is used as the gate insulting film 13.

After cleaning the surface of the gate insulating film 13, a lamination film having a refractory metal film and a nitride film is formed using a sputtering method, a vapor deposition method, or a vapor phase growth method. One selected from W, Mo, Ti, Ta, Co, and the like or an alloy thereof is used as the refractory metal film. The nitride film is formed as a barrier film in order to prevent diffusion from the refractory metal film. In addition, an effect of improving adhesiveness between the refractory metal film and the gate insulating film can be achieved by the nitride film. Here, a lamination layer of a lower layer film 14 formed of TaN (tantalum nitride) having a thickness from 30 nm to 100 nm and an upper layer film 15 formed of W (tungsten) having a thickness from 300 nm to 400 nm is formed. The tungsten film can be formed by a sputtering method or a chemical vapor deposition (CVD) method. Further, in the case of performing reactive ion etching, a tungsten film obtained by a CVD method is etched at a speed of approximately three times faster than that of a tungsten film obtained by a sputtering method.

Then, resist masks 16a and 16b are formed with the use of photolithography technique (FIG. 1A). Further, the resist masks 16a and 16b are patterns connected to each other. The resist mask 16*a* having a minute width so as to have a triangular shape by the subsequent etching step is formed in a location (typically, a gate electrode) in which a minute TFT is to be formed. The resist mask 16*a* having a minute width may be exposed to light by a laser lithography method. In addition, the resist mask 16*b* having a width so as to make a gate wiring having a trapezoidal shape by the subsequent etching step (typically, a gate wiring or a leading out wiring) is formed in a location which is electrically connected to a wiring in an upper layer in the subsequent step. The width of these resist masks may be determined by appropriately selecting a refractory metal material, a resist material, or an etching condition.

Figure 1B:
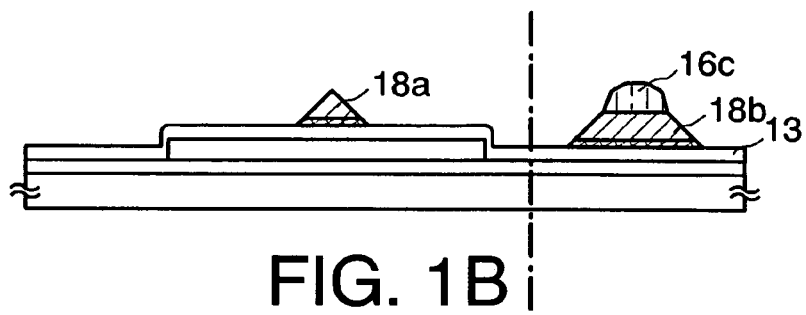

And then, etching is performed while the resist mask is made to recede to form a gate electrode 18*a* and a gate electrode 18*b* (FIG. 1B). Further, the gate electrode 18*a* and the gate electrode 18*b* are wiring patterns connected to each other. According to this etching, the resist mask 16*a* having a minute width disappears by the recession. On the other hand, the resist mask 16*b* recedes by the etching to be a remaining resist mask 16*c*.

Figure 2A:
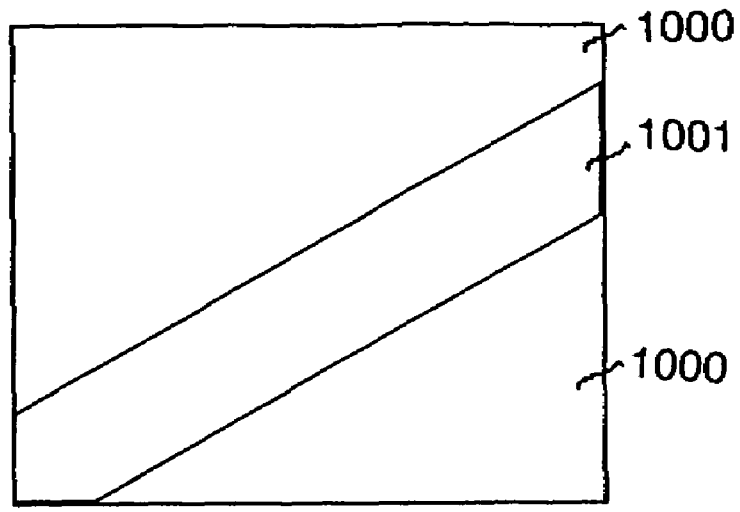
FIGS. 2A and 2B are each a schematic view and a photographic diagram of a pattern.
Figure 2B:
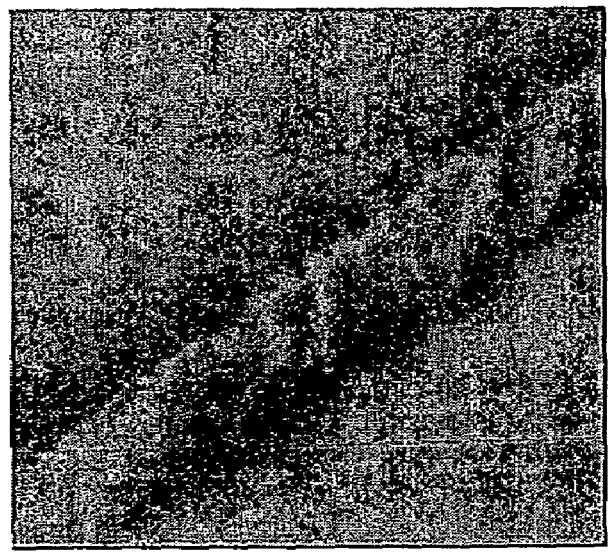

A patterning experiment is actually performed. FIG. 2B is a photographic diagram of a pattern of a tungsten film having a triangular shape (line width: 0.16 μm) obtained by forming a tungsten film over a glass substrate with a sputtering method and by performing dry etching to the tungsten film by using a resist pattern having a linear shape of 0.6 μm width. Further, FIG. 2A shows a schematic view, which includes a substrate surface 1000 and an electrode side portion 1001.

Figure 3A:
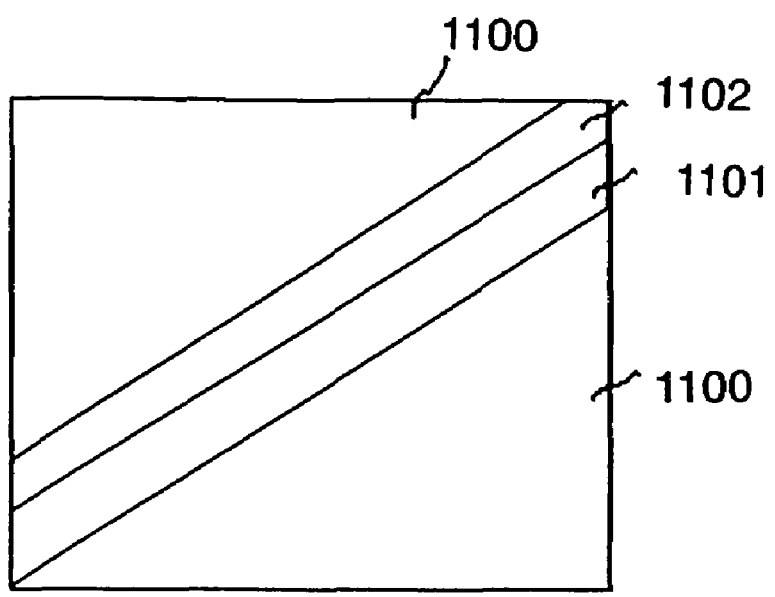
FIGS. 3A and 3B are each a schematic view and a photographic diagram of a pattern.
Figure 3B:
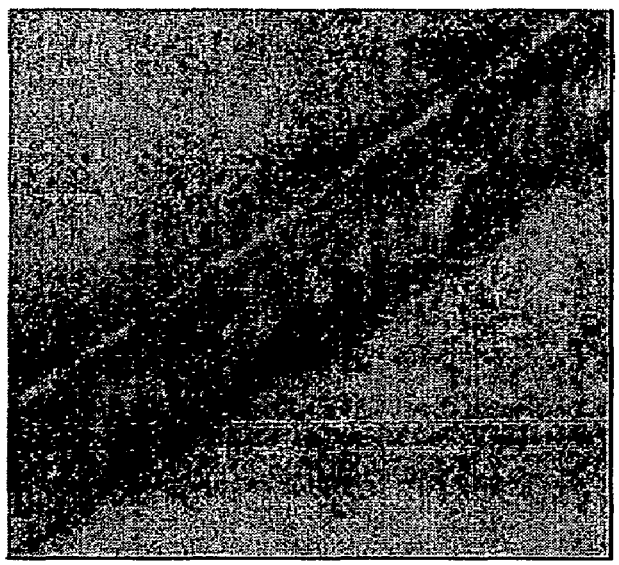

FIG. 3B is a photographic diagram of a pattern of a tungsten film having a trapezoidal shape (line width: 0.3 μm) obtained by forming a tungsten film over a glass substrate with a sputtering method and by performing dry etching to the tungsten film by using a resist pattern having a linear shape of 0.7 μm width. Further, FIG. 3A shows a schematic view, which includes a substrate surface 1100, an electrode side portion 1101, and a resist 1102 on the electrode.

In the experiment, the wiring having a triangular shape of 0.16 μm width can be obtained with the use of the resist pattern having a linear shape of 0.6 μm width; however, the wiring shape is not limited in particular and can be appropriately set by a material, film thickness, or an etching condition. In the above experiment, a wiring having a trapezoidal shape can be obtained by setting the width of the resist to 0.7 μm or more; however, the wiring having a trapezoidal shape can be processed to be a wiring having a triangular shape by performing isotropic etching. For example, after obtaining a wiring having a trapezoidal shape of 0.6 μm width by etching with the use of a resist pattern of 1 μm width, a wiring having a triangular shape of approximately 0.2 μm width can be obtained by isotropic etching which corresponds to 0.2 μm. However, since isotropic etching is performed, a film thickness, in other words, the height of a triangle becomes thinner.

In addition, width in this specification means a width of a lower side being in contact with a base film, and means a length corresponding to a base in the case of a triangular shape and a length corresponding to a lower side in the case of a trapezoidal shape.

Further, in the case where a contact hole to be formed later is set to have a diameter of 1 μm, the upper side length of a trapezoid is preferably set to be 3 μm considering a margin, and in FIG. 1D, a width of a wiring in a right side of a dashed line is preferably set to approximately 3.2 μm or more.

Here, a gate electrode portion having a triangular shape of 0.16 μm width and a gate wiring having a trapezoidal shape of 3.2 μm width are formed to be connected to each other by etching once. Further, seeing from the top side of the substrate, a wide gate wiring having a trapezoidal shape diverges into a narrow gate electrode having a triangular shape. In this specification, among wirings, an overlapped portion with the semiconductor layer and an adjacent portion thereof are referred to as a gate electrode, and the other portion is referred to as a gate wiring.

Figure 1C:
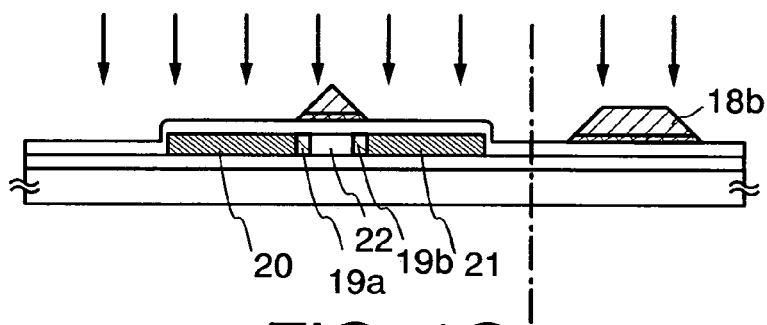

Then, the resist mask 16*c* is removed by stripping treatment with the use of solution for stripping a resist or ashing treatment, and then, appropriately adding an impurity element imparting n-type conductivity (P, As, or the like) or an impurity element imparting p-type conductivity (B or the like) to the semiconductor layer 12 (FIG. 1C). The impurity element is added to the semiconductor layer through the gate insulating film 13 by an ion doping method or an ion implantation method. In addition, the doping may be performed selectively by providing a mask, and may have a low-concentration drain (also referred to as an LDD: Lightly Doped Drain) structure having an LDD region 19*a* and 19*b* between a channel formation region 22 and a drain region 21 (or source region 20). In this structure, a region, in which an impurity element is added to form a low-concentration region 19*a* and 19*b* exists between a channel formation region 22 and a source region 20 or a drain region 21, in which an impurity element is added to form a high-concentration region, and the low-concentration regions 19*a* and 19*b* are referred to as LDD regions.

Here, as shown in FIG. 1C, source and drain regions (high-concentration impurity regions) 20 and 21 and low-concentration impurity regions 19*a* and 19*b* partially overlapped with the gate electrode having a triangular shape can be formed in a self-aligning manner by doping phosphorous through the gate insulating film 13 and an edge portion of the gate electrode 18*a* having a triangular shape. A structure shown in FIG. 1C is referred to as a so-called GOLD (Gate Overlapped LDD) structure in which an LDD region is overlapped with a gate electrode with an insulating film interposed therebetween.

In addition, an interlayer insulating film formed of a nitride insulating film may be formed before the doping in order to prevent a wiring from being modified or stripped. In this case, the impurity element is added to the semiconductor layer through the gate insulating film and the interlayer insulating film in the doping step.

In the subsequent step, a first interlayer insulating film 23 is formed, and hydrogenation treatment and activation treatment are performed. Then, a second interlayer insulating film 24 is formed, and then, contact holes reaching the source region and the drain region is formed. An insulating film obtained by a coating method is preferably used as the second interlayer insulating film 24 in order to prevent short circuit between the gate electrode having a triangular shape and an upper wiring or electrode.

Then, a conductive film is formed and patterned to form a source electrode 25 and a drain electrode 26; and thus, a TFT (n-channel TFT) is completed. A leading out electrode 27 is simultaneously formed (FIG. 1D). The source electrode 25, the drain electrode 26, and the leading out wiring 27 are formed of a single layer having an element selected from Mo, Ta, W, Ti, Al, and Cu, or an alloy material or a compound material containing the element as its main component, or a lamination layer thereof. For example, a three layer structure of a Ti film, a pure-Al film, and a Ti film, or a three layer structure of a Ti film, an Al alloy film containing Ni and C, and a Ti film is used. Further, in consideration of forming an interlayer insulating film and the like in a subsequent step, the cross section of the electrode preferably has a tapered shape.

Figure 1D:
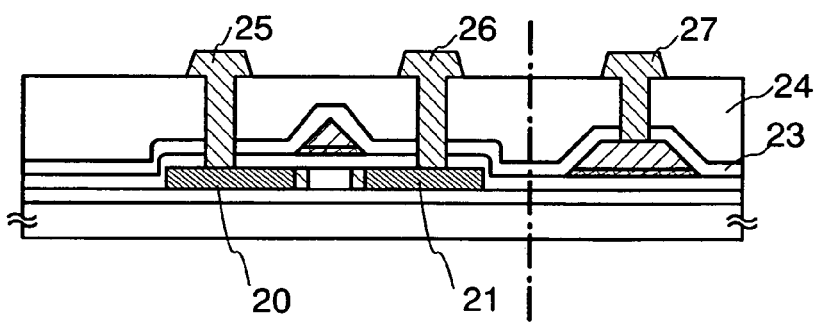

Further, the invention is not limited to the TFT structure in FIG. 1D, and if necessary, an LDD region which is not overlapped with a gate electrode may be provided, or a TFT without an LDD region may be used.

Here, an n-channel TFT is used for the description; however, it goes without saying that a p-channel TFT can be formed using a p-type impurity element instead of an n-type impurity element. In addition, an n-channel TFT and a p-channel TFT can be formed over the same substrate by separately and sequentially adding an n-type impurity element and a p-type impurity element by using a mask.

The gate wiring obtained according to the invention has a partially minute location (electrode having a triangular shape in its cross section) and can be connected to the upper layer wiring through the contact hole.

Further, parasitic capacitance can be reduced since a portion where a distance between the gate electrode and the source electrode (and the drain electrode) placed in the upper portion being long can be formed by making the gate electrode to have a triangular shape. Therefore, a distance between the source electrode and the drain electrode can be narrower by making the gate electrode to have a triangular shape because it is not necessary to consider parasitic capacitance; and thus, the gate wiring can be formed to be further minute. In the case of narrowing the distance between wirings, the upper edge portion of the electrode comes closer to the wiring in the upper layer when a wiring having a rectangular shape is used, and therefore, parasitic capacitance is easily formed.

According to the invention, a channel length of the channel formation region 22 can be shortened, increase in ON current and reduction in gate capacitance can be realized, and a semiconductor integrated circuit which operates at high speed (a CPU, a memory, or the like) can be obtained over a glass substrate (or a plastic substrate).

Further, since a TFT placed in a pixel portion can be formed to be minute, the aperture ratio can be raised when the TFT is applied to a switching element of a liquid crystal display device. The gate electrode in the pixel portion is minute; however, a gate wiring is frequently extracted outside the pixel portion in a liquid crystal display device. In addition, when the TFT is applied to a driver circuit of a liquid crystal display device, high speed operation and narrow frame can be realized.

Moreover, since a TFT placed in a pixel portion can be made to be minute likewise, when the TFT is applied to a light emitting display device having an EL element, the aperture ratio can be raised. In the case of a light emitting display device, plurality of TFTs are formed in one pixel and gate electrodes are electrically connected so as to configure a pixel circuit by connecting a plurality of TFTs to each other. Equally, when the TFT is applied to a driver circuit of a light emitting display device, a driver circuit which operates at high speed and occupies as little space as possible can be formed over the same substrate as that of the pixel circuit.

Further, an EL element that has a layer including an organic compound as a light emitting layer has a structure in which the layer including the organic compound (hereinafter, referred to as an EL layer) is interposed between an anode and a cathode, and luminescence (Electro Luminescence) is obtained from the EL layer by applying an electric field between the anode and the cathode. The luminescence from the EL element includes luminescence (fluorescence) in returning from a singlet excited state to a ground state and luminescence (phosphorescence) in returning from a triplet excited state to a ground state.

In the display device according to the invention, a driving method for an image display is not especially limited. For example, a dot-sequential driving method, a line-sequential driving method, a frame-sequential driving method, or the like may be used. Typically, the line-sequential driving method is used, and a time-division gray scale driving method or an area gray scale driving method may be appropriately used. An image signal input to a source line of the display device may be either an analog signal or a digital signal. In addition, a driver circuit or the like may be designed appropriately in accordance with the image signal.

In a light emitting device using a digital video signal, there are a light emitting device in which a video signal with a constant voltage (CV) is input to a pixel and a light emitting device in which a video signal with a constant current (CC) is input to a pixel. The light emitting device using a video signal with a constant voltage (CV) includes a light emitting device in which a constant voltage is applied to a light-emitting element (CVCV) and a light emitting device in which a constant current is applied to a light-emitting element (CVCC). In addition, the light emitting device using a video signal with a constant current (CC) includes a light emitting device in which a constant voltage is applied to a light-emitting element (CCCV) and a light emitting device in which a constant current is applied to a light-emitting element (CCCC).

Furthermore, a CPU, a display portion, and a memory can be formed using a circuit including a TFT over the same substrate, though a circuit design and a manufacturing step are complicated.

Embodiment Mode 2

A manufacturing method for realizing a wiring or an electrode having a triangular shape is not limited to a method shown in Embodiment Mode 1, and another method can be used. Here, as another example, a gate electrode having a triangular shape is formed by etching only a gate electrode for several times by using two sheets of photo masks. An example of forming a double gate structure having two channel formation regions for lowering an OFF current value sufficiently is shown in FIGS. 4A to 4E.

By the method of making a resist recede by etching once shown in Embodiment Mode 1, it is difficult to narrow a distance between two channel formation regions in the case of forming the double gate structure. Therefore, two electrodes each having a triangular shape are formed by previously forming a wiring having a taper, and then, performing etching so as to divide the wiring.

First, in the similar way as Embodiment Mode 1, a base insulating film 411 formed of an insulating film such as a silicon oxide film, a silicon nitride film, or a silicon oxynitride film ($SiO_xN_y$) is formed over a substrate 410 having an insulating surface.

Next, in the similar way as in Embodiment Mode 1, a semiconductor film having an amorphous structure is formed over the base insulating film 411, and then patterning is performed with the use of photolithography technique to obtain a semiconductor layer 412. Then, in the similar way as in Embodiment Mode 1, an insulating film containing silicon as its main component, which is to be a gate insulating film 413, is formed.

After cleaning the surface of the gate insulating film 413, a single layer film comprising a refractory metal film is formed using a sputtering method, a vapor deposition method, or a vapor phase growth method. One selected from W, Mo, Ti, Ta, Co, and the like or an alloy thereof is used as the refractory metal film. A nitride film may be formed as a barrier film of a lower layer to have a lamination structure so as to prevent diffusion from the refractory metal film. Then, a resist mask is formed with the use of photolithography technique.

Figure 4A:
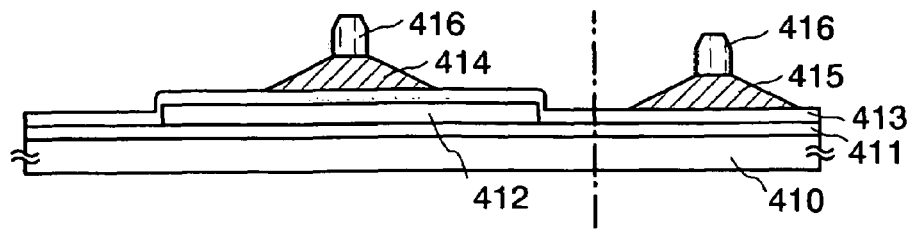
FIGS. 4A to 4E are cross-sectional views of steps, which are explained in Embodiment Mode 2.

Then, etching is performed while the resist mask is made to recede to form electrodes 414 and 415 having a first shape (FIG. 4A). A resist mask 416 remained after the recession by etching is shown in FIG. 4A.

Figure 4B:
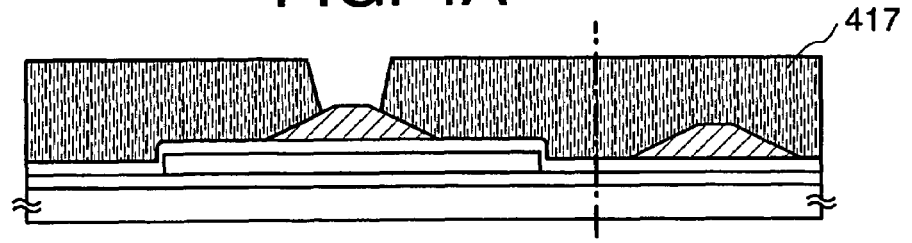
Figure 4C:
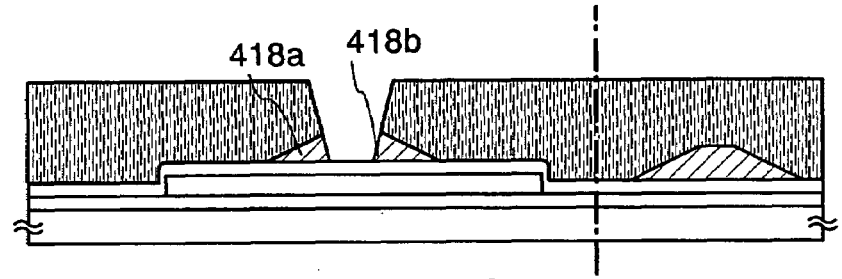
Figure 5A:
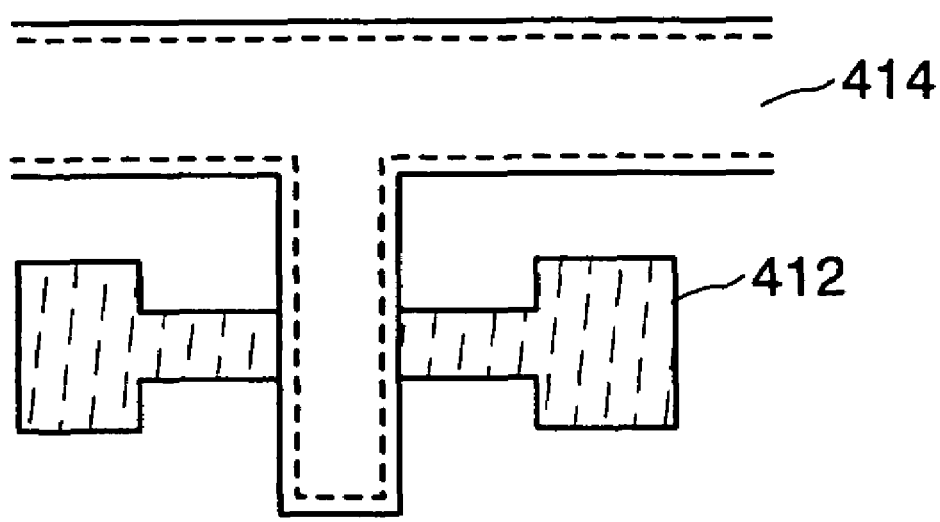
FIGS. 5A and 5B are top views being explained in Embodiment Mode 2.

Then, a resist mask 417 is newly formed after removing the resist mask 416 (FIG. 4B). Here, an opening edge of the resist mask is placed on a tapered portion of the electrode 414 having a first shape. Therefore, the tapered portion is preferably long and at least approximately 3 µm is required considering alignment accuracy of a mask. Further, FIG. 5A shows a top view at the time of removing the resist mask 416, and similar parts are marked in common with the same reference numerals. A dotted line on the electrode 414 having a first shape in FIG. 5A shows an interface between a top surface and a slant, and the outside of the dotted line is a slant.

Then, etching is performed to divide the electrode 414 into two gate electrodes 418a and 418b. The gate electrodes 418a and 418b are each formed in a triangular shape by this second etching. Here, each of the gate electrodes 418a and 418b have a tapered shape to have favorable coverage; however, the gate electrodes 418a and 418b may be etched so that the side faces of the gate electrodes 418a and 418b are perpendicular. In the case where etching is performed so that the side faces of the gate electrodes 418a and 418b are perpendicular, triangular shape of the gate electrodes 418a and 418b each have a right-angled triangle.

Figure 4D:
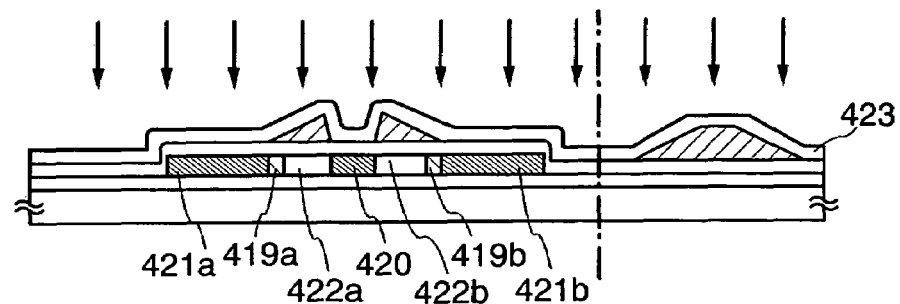
Figure 5B:
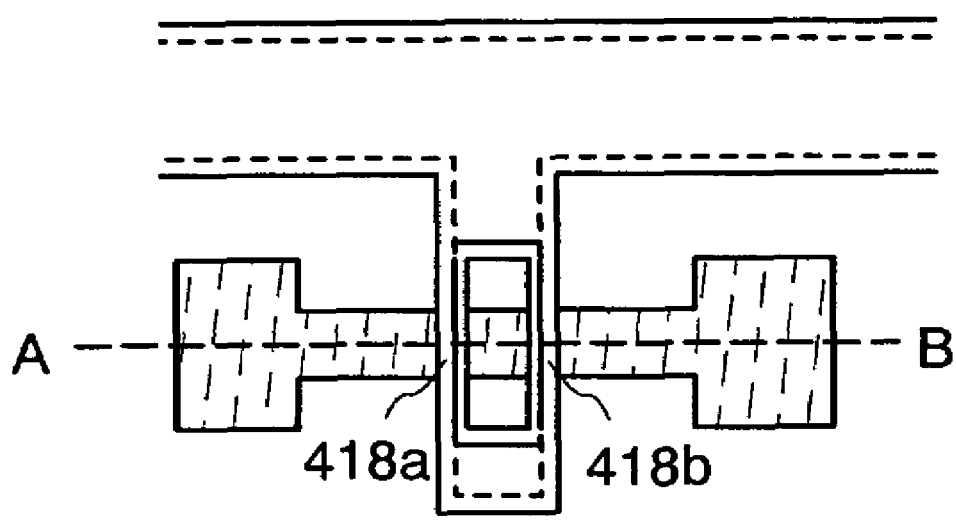

After removing the resist mask 417, a first interlayer insulating film 423 formed of a nitride insulating film is formed. Then, an impurity element imparting n-type conductivity (P, As, or the like) or an impurity element imparting p-type conductivity (B or the like) is appropriately added to the semiconductor layer 412 (FIG. 4D). The impurity element is added to the semiconductor layer 412 through the gate insulating film 413 and the first interlayer insulating film 423 by an ion doping method or an ion implantation method. Further, FIG. 5B shows a top view at a time of removing the resist mask, and similar parts are marked in common with the same reference numerals. A cross section taken along dotted line of A-B corresponds to the left part of FIG. 4D. Here, a double gate structure is used by opening a wiring as shown in FIG. 5B.

Here, as shown in FIG. 4D, source and drain regions (high-concentration impurity regions) 420, 421a, and 421b, and LDD regions (low-concentration impurity regions) 419a and 419b each partially overlapped with the gate electrode having a triangular shape can be formed in a self-aligning manner by doping phosphorous through an edge portion of the gate electrode 418a and 418b having a triangular shape.

Further, the doping may be selectively performed by providing a mask, and doping for forming the LDD regions (low-concentration impurity regions) and the doping for forming the source and drain regions (high-concentration impurity regions) may be separately performed.

Then, hydrogenation treatment and activation treatment are performed, then, a second interlayer insulating film 424 is formed, and then, contact holes reaching the source region and the drain regions 421a and 421b are formed. An insulating film obtained by a coating method is preferably used as the second interlayer insulating film 424 in order to prevent short circuit between the gate electrode having a triangular shape and an upper wiring or electrode.

Figure 4E:
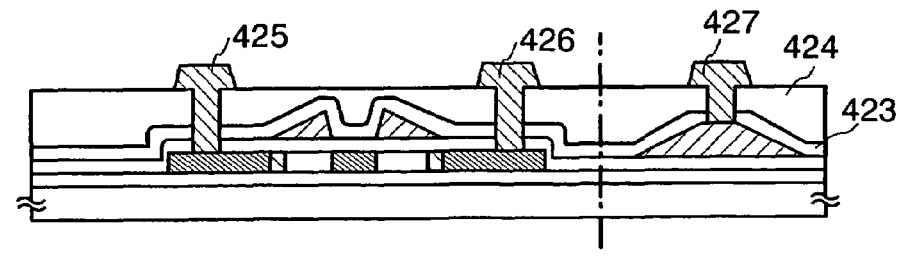

Then, a conductive film is formed and patterned to form a source electrode 425 and a drain electrode 426; and thus, a TFT (n-channel TFT) is completed. A leading out electrode 427 is simultaneously formed (FIG. 4E). The source electrode 425, the drain electrode 426, and the leading out wiring 427 are formed of a single layer having an element selected from Mo, Ta, W, Ti, Al, and Cu, or an alloy material or a compound material containing the element as its main component, or a lamination layer thereof. For example, a three layer structure of a Ti film, a pure-Al film, and a Ti film, or a three layer structure of a Ti film, an Al alloy film containing Ni and C, and a Ti film is used. Further, in consideration of forming an interlayer insulating film and the like in a subsequent step, the cross section of the electrode preferably has a tapered shape.

Further, the present invention is not limited to the TFT structure in FIG. 4E, and if necessary, an LDD region which is not overlapped with a gate electrode may be provided, or a TFT without an LDD region may be used.

The gate wiring obtained according to the invention has a partially minute location (electrode having a triangular shape in its cross section) and can be connected to the upper layer wiring through a contact hole.

Moreover, this embodiment mode can be freely combined with Embodiment Mode 1.

Embodiment Mode 3

Here, an example of thin film transistor layout using an electrode having a triangular shape is shown.

Figure 6A:
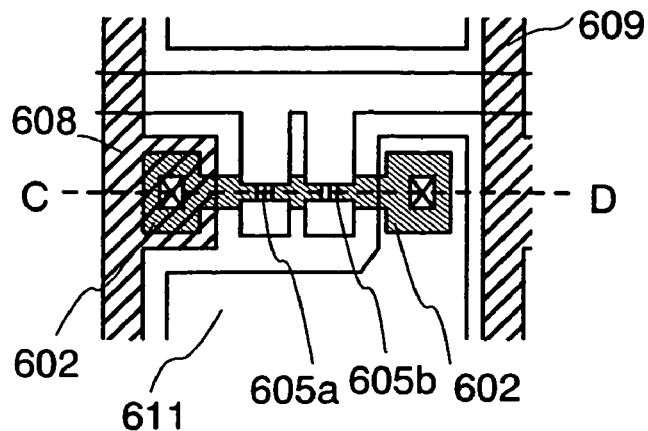
FIGS. 6A to 6C are top views being explained in Embodiment Mode 3.

FIG. 6A is a top view in which a TFT is laid out as a switching element placed to a pixel portion of a liquid crystal display device.

As shown in FIG. 6A, a gate wiring is narrowed in a portion overlapped with a semiconductor layer, and the narrow portions become gate electrodes 605a and 605b each having a triangular shape. In addition, a source wiring 608 is connected to a source region or drain region 602. A pixel electrode 611 is also connected to the source or a drain region 602. The reference numeral 609 denotes a source wiring in an adjacent pixel.

Figure 6B:
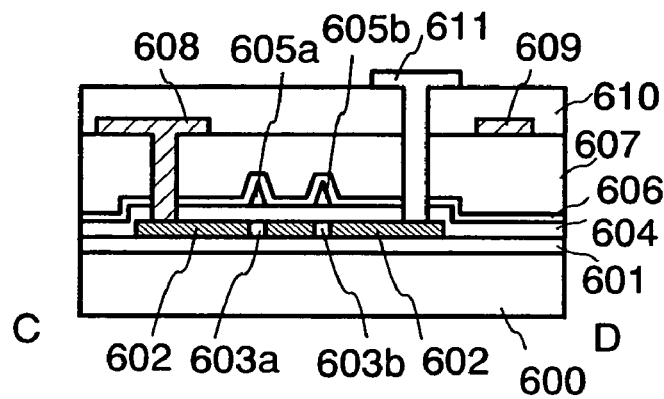

FIG. 6B shows a cross-sectional view taken along dotted line C-D in FIG. 6A.

As shown in FIG. 6B, a base film 601 formed of an inorganic insulating film, an active layer at least including channel formation regions 603a and 603b and the source and drain regions 602, a gate insulating film 604 which covers the active layer, gate electrodes 605a and 605b, and interlayer insulating films 606, 607, and 610 which covers the gate electrodes 605a and 605b are provided over a substrate having an insulating surface.

The gate electrodes 605a and 605b each having a triangular shape in its cross section are overlapped with the channel formation regions 603a and 603b with the gate insulating film 604 interposed therebetween. The TFT can be minute by forming the gate electrodes 605a and 605b having a triangular shape, and thus, channel lengths of the channel formation regions 603a and 603b can be shortened.

The gate electrodes 605a and 605b are placed over the even active layer, and a wide electrode (having a trapezoidal shape in its cross section) is placed over a step portion of the edge surface of the active layer. In addition, the edge portion of the gate electrode is made to be wider than the portion with a triangular shape so as not to have a sharp edge by being tapered with etching.

As shown in FIG. 6A, since the gate wiring is made to be minute not wholly but partially, a wiring having low resistance can be realized.

Moreover, the interlayer insulating films 606 is preferably formed of a nitride film (nitride metal film or a nitride silicon film) so as to prevent stripping from the gate insulating film. In addition, the interlayer insulating film 606 has an effect of protecting the low-intensity gate electrode having a triangular shape when the interlayer insulating film 607 is subsequently formed by a coating method.

Figure 6C:
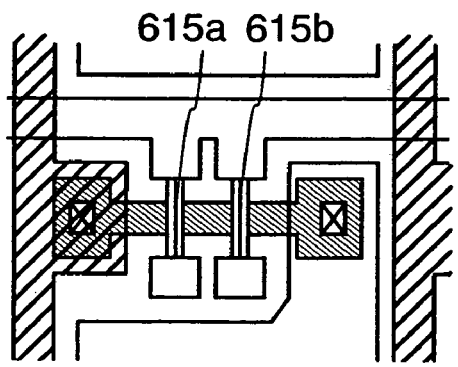

In addition, the TFT using an electrode having a triangular shape is not especially limited to the layout in FIG. 6A, and an electrode having a triangular shape crossing a step in an edge surface of the active layer may be formed. FIG. 6C shows an example of another layout different from that of FIG. 6A.

In FIG. 6C, electrodes 615a and 615b each having a triangular shape crossing a step in an edge surface of the active layer are formed.

Further, this embodiment mode can be freely combined with Embodiment Mode 1 or 2.

Embodiment Mode 4

In this embodiment mode, an example in which a thickness of a gate wiring is made to be different from a thickness of a gate electrode formed from the same material as the gate wiring by etching is described with reference to FIGS. 7A to 7E.

First, in the similar way as in Embodiment Mode 1, a base insulating film 711 and a semiconductor layer 712 are formed over a substrate 710 having an insulating surface.

Then, after cleaning is performed for removing undesired substance (remaining resist, solution for stripping resist, and the like) produced during the patterning, an insulating film containing silicon as its main component, which is to be a first gate insulating film 713a, is formed. An insulating film such as a silicon oxide film or a silicon oxynitride film ($SiO_xN_y$: X>Y) is used as the first gate insulting film 713a.

And then, an insulating film containing silicon as its main component, which is to be a second gate insulating film 713b, is continuously formed. An insulating film such as a silicon nitride film or a silicon oxynitride film ($SiO_xN_y$: X<Y) is used as the second gate insulting film 713b.

After cleaning the surface of the second gate insulating film 713b, a refractory metal film 714 is formed using a sputtering method, a vapor deposition method, or a vapor phase growth method. One selected from W, Mo, Ti, Ta, Co, and the like or an alloy thereof is used as the refractory metal film.

Figure 7A:
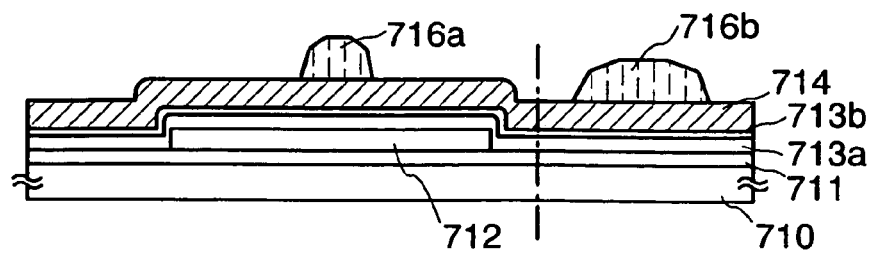
FIGS. 7A to 7E are cross-sectional views of steps, which are explained in Embodiment Mode 4.

Next, resist masks 716a and 716b are formed with the use of photolithography technique (FIG. 7A). Further, the resist masks 716a and 716b are patterns connected to each other. The resist mask 716a having a minute width so as to have a triangular shape by the subsequent etching step is used to a location (typically, a gate electrode) in which a minute TFT is to be formed.

Figure 7B:
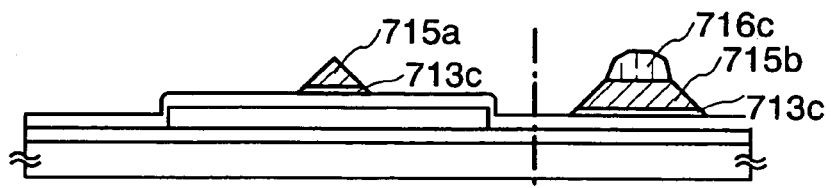

Then, etching is performed while the resist mask is made to recede to form an electrode 715a having a triangular shape and a wiring 715b having a trapezoidal shape (FIG. 7B). Further, the electrode 715a having a triangular shape and the wiring 715b having a trapezoidal shape are wiring patterns connected to each other. Moreover, a second gate insulating film 713c is formed at the same time as the etching or by performing etching separately. According to the etching, the resist mask 716a having a minute width disappears by the recession. On the other hand, the resist mask 716b is receded by the etching to be a remaining resist mask 716c.

Figure 7C:
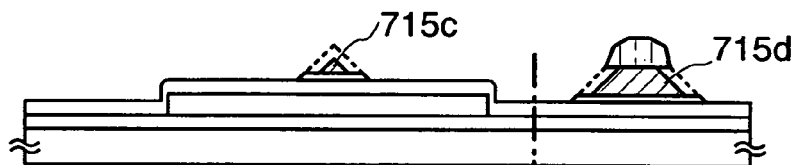

And then, isotropic etching is performed with the resist mask 716c remaining to obtain a gate electrode 715c in which a height of the electrode having a triangular shape is lowered and a line width is made to be minute (FIG. 7C). A line width of a gate wiring 715d having a trapezoidal shape is made to be minute, but a film thickness thereof is not changed. Further, the etching is performed in such a condition that the second gate insulating film 713c is not etched. Favorable coverage can be obtained by forming the gate electrode 715c in which a height of the electrode having a triangular shape is lowered.

Next, a first interlayer insulating film 723 formed of a nitride insulating film is formed so as to prevent a wiring from being modified or stripped. The second gate insulating film 713c is a silicon nitride film or a silicon nitride oxide film, and therefore, it is desirable since adhesiveness between the second gate insulating film 713c and the first interlayer insulating film 723 can be enhanced. Moreover, an edge portion of the second gate insulating film 713c is away from an edge portion of the gate electrode 715c and a region where a top surface of the second gate insulating film 713c is in contact with the first interlayer insulating film 723 is wide, and therefore, the first interlayer insulating film 723 is hard to peel off and the gate electrode 715c is protected by being wrapped. The first interlayer insulating film 723 also has an effect of protecting a wiring or an electrode from damage due to subsequent doping.

Figure 7D:
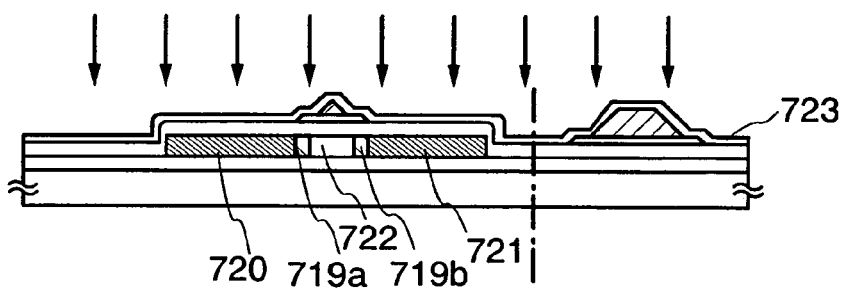

Then, the resist mask 716c is removed by stripping treatment with the use of solution for stripping a resist or ashing treatment, and then appropriately doping the semiconductor layer 712 with an impurity element imparting n-type conductivity (P, As, or the like) or an impurity element imparting p-type conductivity (B or the like) (FIG. 7D). The degree of doping is different between a location in which the second gate insulating film 713c exists and a location in which only the first gate insulating film 713a exists; and thus, source and drain regions (high-concentration impurity regions) 720 and 721 and LDD regions (low-concentration impurity regions) 719a and 719b can be formed in a self-aligning manner. In the doping step, the semiconductor layer 712 is doped through the gate insulating film 713a and 713c and the first interlayer insulating film 723 by an ion doping method or an ion implantation method.

A structure shown in FIG. 7D is a so-called LDD structure in which an LDD region is placed in opposite sides of a channel formation region.

In the subsequent step, hydrogenation treatment and activation treatment are performed. Then, a second interlayer insulating film 724 is formed, and then, a contact holes reaching source region and a drain regions are formed. Moreover, an insulating film obtained by a coating method is preferably used as the second interlayer insulating film 724 in order to prevent short circuit between the gate electrode having a triangular shape and an upper wiring or electrode.

Figure 7E:
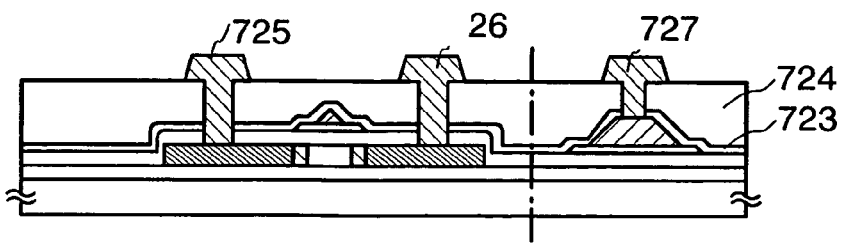

Then, a conductive film is formed and patterned to form a source electrode 725 and a drain electrode 726; and thus, a TFT (n-channel TFT) is completed. A leading out electrode 727 is simultaneously formed (FIG. 7E). The source electrode 725, the drain electrode 726, and the leading out wiring 727 are formed of a single layer having an element selected from Mo, Ta, W, Ti, Al, and Cu, or an alloy material or a compound material containing the element as its main component, or a lamination layer thereof. For example, a three layer structure of a Ti film, a pure-Al film, and a Ti film, or a three layer structure of a Ti film, an Al alloy film containing Ni and C, and a Ti film is used. Further, in consideration of forming an interlayer insulating film and the like in a subsequent step, the cross section of the electrode preferably has a tapered shape.

Further, the present invention is not limited to the TFT structure in FIG. 7E, and if necessary, an LDD region which is overlapped with a gate electrode may be provided, or a TFT without an LDD region may be used.

Here, an n-channel TFT is used for description; however, it goes without saying that a p-channel TFT can be formed using a p-type impurity element instead of an n-type impurity element. In addition, an n-channel TFT and a p-channel TFT can be formed over the same substrate by separately and sequentially adding an n-type impurity element and a p-type impurity element by using a mask.

Furthermore, a CPU, a display portion, and a memory can be formed over the same substrate using a circuit including a TFT, though a circuit design and a manufacturing step are complicated.

Moreover, this embodiment mode can be freely combined with Embodiment Mode 1, Embodiment Mode 2, or Embodiment Mode 3.

The invention having the above constitution is further described in detail with an embodiment which will be described hereinafter.

Embodiment 1

Figure 8:
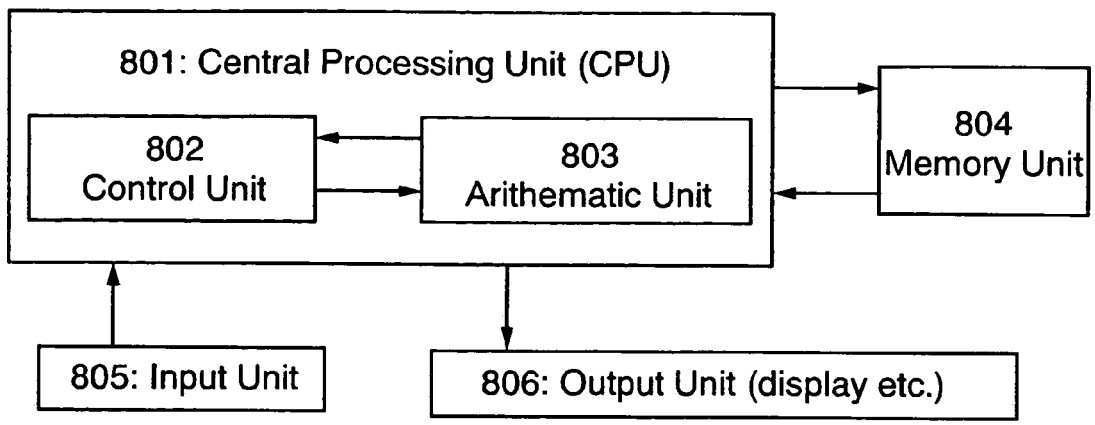
FIG. 8 is a block diagram of a CPU.

In this embodiment, an example in which a CPU or a memory is structured using a circuit including a TFT obtained in the above Embodiment Modes 1 through 4 over a substrate having an insulating surface (typically, a glass substrate or a plastic substrate) is described with reference to FIG. 8.

Reference numeral 801 denotes a central processing unit (also referred to as a CPU), reference numeral 802 denotes a control unit, reference numeral 803 denotes an arithmetic unit, reference numeral 804 denotes a memory unit (also referred to as a memory), reference numeral 805 denotes an input unit, and reference numeral 806 denotes an output unit (a display portion or the like).

The central processing unit 801 includes the arithmetic unit 803 and the control unit 802. The arithmetic unit 803 includes an arithmetic logic unit (ALU) for performing arithmetic operations such as addition and subtraction, and logical operations such as AND, OR, and NOT; various registers for temporarily storing data or results of the operations; a counter for counting the number of "1" which is input, and the like.

A circuit composing the arithmetic unit 803, for example, an AND circuit, an OR circuit, a NOT circuit, a buffer circuit, or a resistor circuit can be composed of TFTs. In order to obtain high electron field-effect mobility, a semiconductor film, which is crystallized by continuous wave laser light, may be used as an active layer of the TFTs. A method for obtaining a polysilicon film in which an amorphous silicon film is irradiated with a continuous wave type laser light; a method for obtaining the polysilicon film by heating an amorphous silicon and then being irradiated with a continuous wave type laser light; or a method for obtaining a polysilicon film by adding a metal element as catalyst to an amorphous silicon film, followed by obtaining a polysilicon film by heating, then obtaining the polysilicon film by being irradiated with continuous wave type laser light may be used. In this embodiment, a channel length direction of a TFT which constitutes the arithmetic unit 803 and a scanning direction of laser light are aligned.

In addition, the control unit 802 has a role of performing an order stored in the memory unit 804 and to control the whole operation. The control unit 802 includes a program counter, an order register, and a control signal generating portion. In addition, the control unit 802 can be constituted of TFTs, and a semiconductor film crystallized by using continuous wave type laser light can be used as an active layer of the TFTs. In this embodiment, a channel length direction of a TFT which constitutes the control unit 802 and a scanning direction of a laser light are aligned.

In addition, the memory unit 804 is a place where data and a command for calculation are stored, and data and/or a program frequently executed in a CPU are stored. The memory unit 804 includes a main memory, an address register, and a data register. Moreover, a cache memory can be used in addition to the main memory. These memories can be formed by an SRAM, a DRAM, a flash memory, or the like. In addition, when the memory unit 804 is constituted of TFTS, a semiconductor film crystallized by using continuous wave type laser light can be formed as an active layer of TFTs. In this embodiment, a channel length direction of a TFT constituting the memory unit 804 and a scanning direction of a laser light are aligned.

In addition, the input unit 805 is a device to take in data or a program from outside. In addition, the output part 806 is a device for displaying a result, typically a display device.

A CPU formed of TFTs having little variation can be fabricated over an insulting substrate by aligning a channel length direction of the TFTs and a scanning direction of a laser light. In addition, a CPU and a display portion can be fabricated over the same substrate. It is preferable to align a channel length direction of a plurality of TFTs placed in each pixel and a scanning direction of a laser light also in a display portion.

In this embodiment, a circuit (a CPU or the like) which operates at high speed is manufactured by making a cross section of a gate electrode have a triangular shape and by making a channel length from 0.2 μm to 1 μm according to Embodiment Mode 1.

Furthermore, a CPU, a display portion, and a memory can be formed over the same substrate, although a circuit design and a manufacturing step become complicated.

Thus, a semiconductor device formed of TFTs which have little variation in an electric characteristic and can operate at high speed can be completed over an insulating substrate.

Moreover, this embodiment can be freely combined with any one of Embodiment Modes 1 through 3.

Embodiment 2

In this embodiment, an example of a structure of a semiconductor device in which at least a pixel portion, a driver circuit for driving a pixel, and an image processing circuit are formed over a substrate having an insulating surface, and an operating method which reduces power consumption are described.

Figure 9:
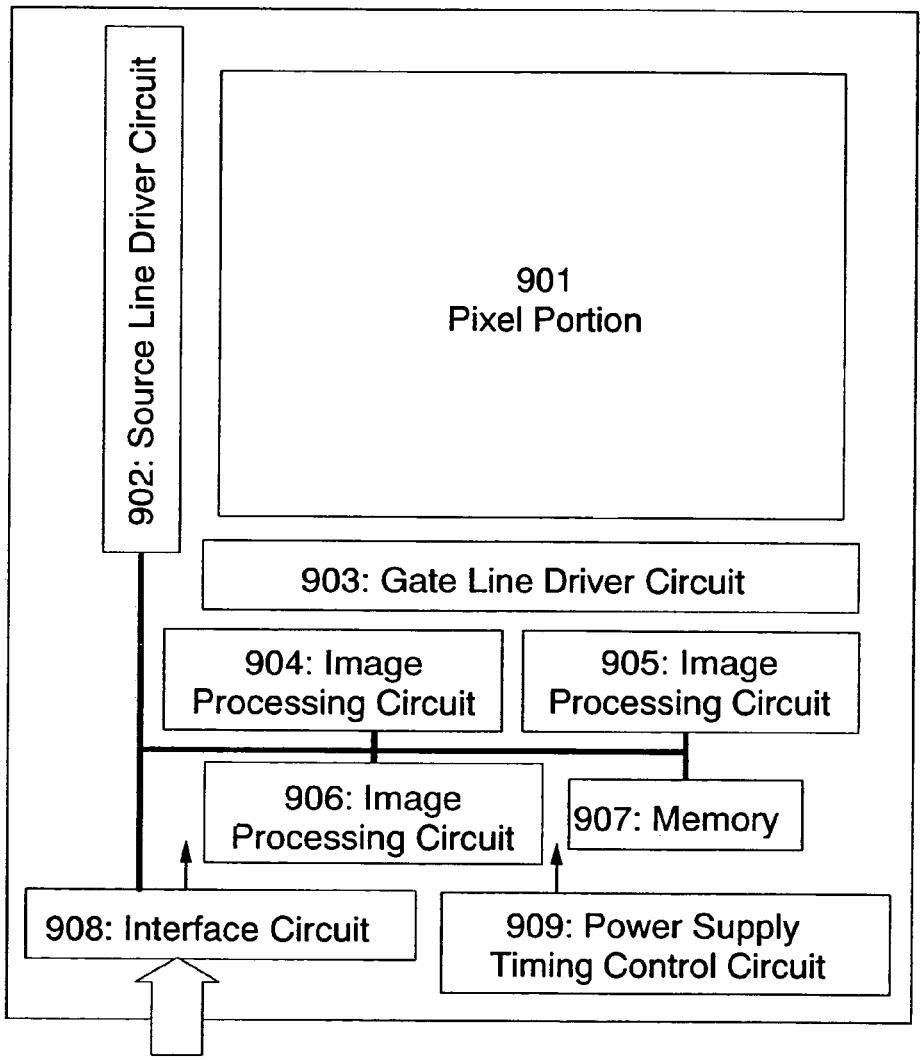
FIG. 9 is a block diagram of a system having a display portion.

FIG. 9 shows an example of a system having a display portion formed over a glass substrate, and a pixel portion 901, a source line driver circuit 902, a gate line driver circuit 903, three image processing circuits 904 to 906 having different functions, a memory 907, an interface circuit 908, and a power supply timing control circuit 909 are provided over the glass substrate. This semiconductor device may be a liquid crystal display device or a light emitting display device using an EL material.

In the block diagram shown in FIG. 9, the pixel portion 901 is a portion for displaying images, and the source line driver circuit 902 and the gate line driver circuit 903 are driver circuits for driving pixels. Image data is input into the source line driver circuit 902. Image data or data to be the basis of images is input into the interface circuit 908 from outside, is converted into suitable internal signals, and then, is outputted into the source line driver circuit 902, the image processing circuits 904 to 906, or the memory 907.

A semiconductor device in which various image processing using the three image processing circuits 904 to 906 and the memory 907 can be performed as a function of the semiconductor device can be considered. For example, by using one or a plurality of the image processing circuits, correction of image distortion; image conversion such as resizing, mosaic process, scrolling, and inversion; multiwindow process; image generation using the memory 807; and composite process thereof, and the like can be performed.

In response to this, various operation modes can be devised. In the semiconductor device having this structure, a nonvolatile latch circuit is suitable for a resistor and a latch circuit of the image processing circuits 904 to 906. In other words, a structure in which the logic state of the image processing circuits 904 to 906 can be recovered by the nonvolatile latch circuit is effective. Thus, it is possible to cut off the power while keeping the operation state of the image processing circuits 904 to 906 and to shut off the power of the image processing circuit which is not used. As a result, power consumption can be reduced.

Even on standby, power supply can be stopped while keeping the state of the system, and thus, it is possible to perform high-speed transition between standby time and operation time and to realize the reduction of the power consumption at the standby time at the same time.

Switching of the operation mode is controlled by the power supply timing control circuit 909. Concretely, storing procedure and recovering procedure may be performed on an image processing circuit which is not used before and after switching modes according to the operation mode.

In this embodiment, the case where whole image processing circuits 904 to 906 can be recovered is described, but the present invention is not limited thereto. A structure in which the logic state of part of circuits (e.g. a circuit C) of the image processing circuits 904 to 906 can be recovered may be used. In that case, it is possible to supply power to the circuit C only when the circuit C is used, and thus, the power consumption can be reduced.

The nonvolatile latch circuit can be applied to the interface circuit, the source line driver circuit, or a gate line driver circuit. As a result, when respective logic circuits do not operate, the power of the logic circuit can be cut off, thereby reducing the power consumption.

Various circuits in this embodiment (the pixel portion 901, the source line driver circuit 902, the gate line driver circuit 903, the three image processing circuits 904 to 906 having different functions, the memory 907, the interface circuit 908, and the power supply timing control circuit 909) can be manufactured by a TFT which can operate at high speed obtained according to Embodiment Modes 1 to 3.

This embodiment can be freely combined with any structure of Embodiment Modes 1 to 3 and Embodiment 1.

Embodiment 3

Figure 10:
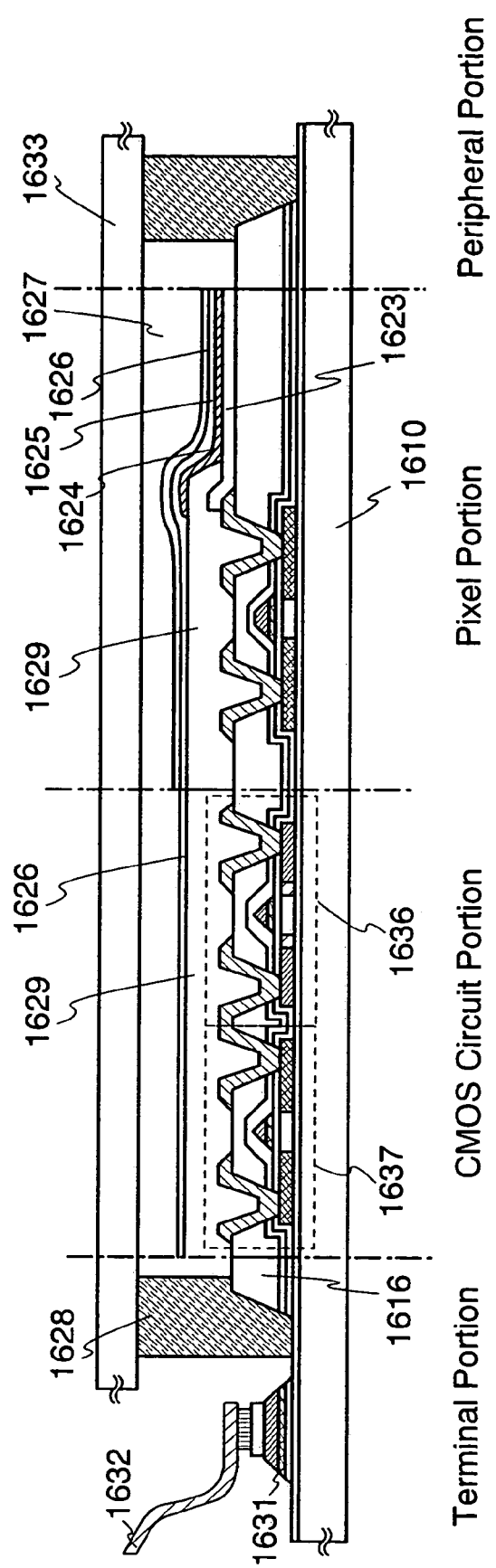
FIG. 10 is a cross-sectional view of an active matrix light emitting device.

In this embodiment, an example in which a pixel portion, a CMOS circuit portion, and a terminal portion are formed over the same substrate is shown with reference to FIG. 10.

In this embodiment, a gate electrode of a TFT in the pixel portion is formed to have a cross section of a trapezoidal shape and a gate electrode of a TFT in the CMOS circuit portion which constitutes part of a CPU or a memory is formed to have a cross section of a triangular shape.

After forming a base insulating film over a substrate 1610, each semiconductor layer is formed. Then, after forming a gate insulating film to cover the semiconductor layers, each gate electrode and terminal electrode are formed. In this embodiment, a channel length is shortened by forming some of cross sections of gate electrodes of TFTs each to have a triangular shape.

Then, the semiconductor layer is doped with an impurity element which imparts n-type conductivity (typically, phosphorous or arsenic) to a semiconductor in order to form an n-channel TFT 1636 and alternatively, the semiconductor layer is doped with an impurity element which imparts p-type conductivity (typically, boron) to a semiconductor in order to form a p-channel TFT 1637; and thus, a source region and a drain region, and also an LDD region if necessary, are formed. The n-channel TFT 1636 and the p-channel TFT 1637 may be formed according to any one of Embodiments 1 to 3. Part of circuits of a semiconductor integrated circuit can be a circuit which operates at high speed without increasing the number of masks by processing part of gate electrodes to have a triangular shape.

Next, a highly heat-resistant planarization film 1616 to serve as an interlayer insulating film is formed. An insulating film which has a skeleton structure comprising a bond of silicon (Si) and oxygen (O), which can be obtained by a coating method, is used as the highly heat-resistant planarization film 1616.

Next, with the use of a mask, the highly heat-resistant planarization film in a peripheral portion is removed while forming contact holes in the highly heat-resistant planarization film 1616 and so on. A tapered shape may be obtained by etching once, or a tapered shape may be obtained by etching more than once.

Next, etching is performed using the highly heat-resistant planarization film 1616 as a mask to selectively remove an exposed portion of the gate insulating film and so on.

Next, after forming a conductive film, etching is performed with the use of a mask to form a drain wiring and a source wiring.

Next, a first electrode 1623 formed of a transparent conductive film, that is, an anode (or a cathode) of an organic light-emitting element is formed. At the same time, a transparent conductive film is formed on the terminal electrode.

In the subsequent steps, an insulator 1629, a layer 1624 including an organic compound, a second electrode 1625 formed of a conductive film, and a transparent protective layer 1626 are formed by a known method, and a sealing substrate 1633 is bonded with the use of a sealing material 1628 to encapsulate the light-emitting element. The space surrounded by the sealing material 1628 is filled with a transparent filling material 1627. Finally, a FPC 1632 is attached to the terminal electrode with an anisotropic conductive film 1631 by a known method. It is preferable to use a transparent conductive film for the terminal electrode, and a transparent conductive film is formed over the terminal electrode formed at the same time as a gate wiring.

According to the steps described above, a pixel portion in which light emitting elements are placed in a matrix, a CMOS circuit, and a terminal portion are formed over the same substrate. Since an n-channel TFT and a p-channel TFT can be formed over the same substrate as shown in the present embodiment, a driver circuit and a protective circuit can be formed over the substrate so that the number of mounted components of IC chips for driving can be reduced.

This embodiment can be freely combined with any structure of Embodiment Modes 1 to 3 and Embodiments 1 and 2.

Embodiment 4

Various electronic devices can be manufactured by incorporating a TFT obtained according to the present invention. As an electronic device, a camera such as a video camera or a digital camera, a goggle type display (head mounted display), a navigation system, an audio reproducing device (an in-car audio system, an audio component system, or the like), a personal computer, a gaming machine, a personal digital assistant (a mobile computer, a cellular phone, a portable gaming machine, an electronic book, or the like), and an image reproducing device provided with a recording medium (specifically, a device which is capable of reproducing a recording medium such as a Digital Versatile Disc (DVD) and provided with a display of displaying the reproduced image). FIGS. 11A to 11H and FIG. 12 show specific examples thereof.

Figure 11A:
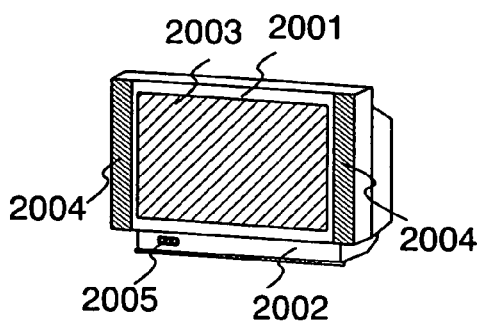
FIGS. 11A to 11H are examples of electronic devices.

FIG. 11A shows a TV set, which includes a casing 2001, a support 2002, a display portion 2003, a speaker portion 2004, a video input terminal 2005, and the like. The invention can be applied to a semiconductor integrated circuit embedded in a TV set and the display portion 2003. Thus, a TV set with a small integrated circuit can be realized. Further, the TV set includes every television for displaying information such as the one for a personal computer, the one for receiving TV broadcasting, and the one for advertising.

Figure 11B:
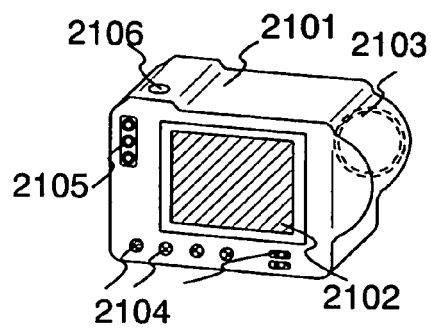

FIG. 11B shows a digital camera, which includes a main body 2101, a display portion 2102, an image receiving unit 2103, an operation key 2104, an external connection port 2105, a shutter 2106, and the like. The invention is applied to a semiconductor integrated circuit (a memory, a CPU, or the like) embedded in a digital camera and the display portion 2102. Thus, a digital camera with a small integrated circuit can be realized by forming various elements over a glass substrate.

Figure 11C:
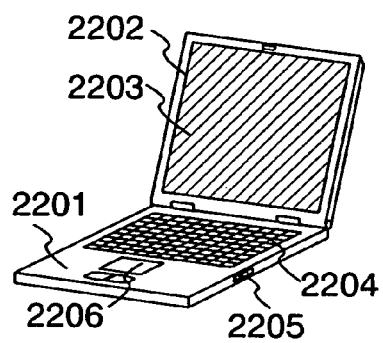

FIG. 11C shows a personal computer, which includes a main body 2201, a casing 2202, a display portion 2203, a keyboard 2204, an external connection port 2205, a pointing mouse 2206, and the like. The invention is applied to a semiconductor integrated circuit (a memory, a CPU, or the like) embedded in a personal computer and the display portion 2203, and a TFT placed in the display portion and a CMOS circuit constituting a CPU can be formed over the same substrate. Thus, a personal computer with a small integrated circuit can be realized.

Figure 11D:
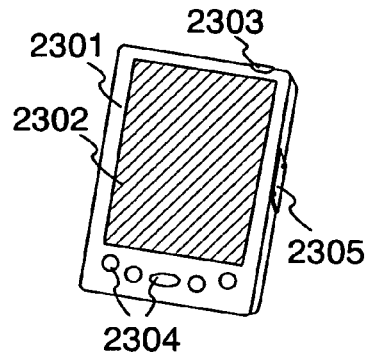

FIG. 11D shows an electronic book, which includes a main body 2301, a display portion 2302, a switch 2303, an operation key 2304, an infrared port 2305, and the like. The invention is applied to a semiconductor integrated circuit (a memory, a CPU, or the like) embedded in an electronic book and the display portion 2302. Thus, an electronic book with a small integrated circuit can be realized.

Figure 11E:
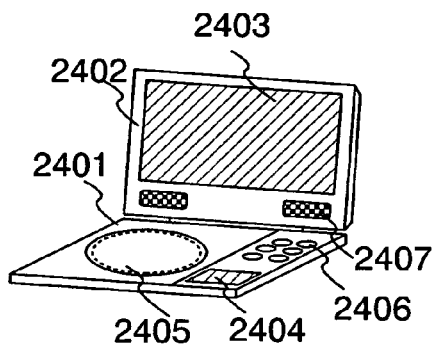

FIG. 11E shows a portable image reproducing device equipped with a recording medium (specifically, a DVD reproducing device), which includes a main body 2401, a casing 2402, a display portion A 2403, a display portion B 2404, a recording medium (a DVD and the like) reading portion 2405, an operation key 2406, a speaker portion 2407, and the like. The display portion A 2403 mainly displays image information, and the display portion B 2404 mainly displays textual information. The invention can be applied to a semiconductor integrated circuit (a memory, a CPU, or the like) embedded in an image reproducing device, the display portion A 2403, and the display portion B 2404. Thus, an electronic book with a small integrated circuit can be realized.

Figure 11F:
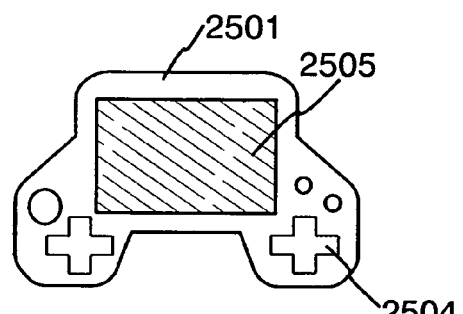

FIG. 11F shows a portable gaming machine, which includes a main body 2501, a display portion 2505, an operation switch 2504, and the like. The invention can be applied to a semiconductor integrated circuit (a memory, a CPU, or the like) embedded in a gaming machine and the display portion 4102 over the same substrate. Thus, a portable gaming machine with a small integrated circuit can be realized.

Figure 11G:
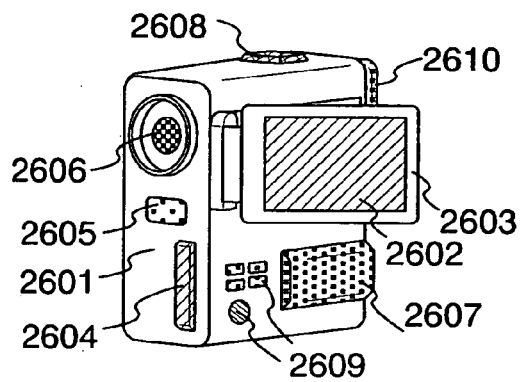

FIG. 11G shows a video camera, which includes a main body 2601, a display portion 2602, a casing 2603, an external connection port 2604, a remote control receiving portion 2605, an image receiving portion 2606, a battery 2607, an audio input portion 2608, an operation key 2609, an eye piece and the like. The invention can be applied to a semiconductor integrated circuit (a memory, a CPU, or the like) embedded in a video camera and the display portion 2602. Thus, a video camera with a small integrated circuit can be realized.

Figure 11H:
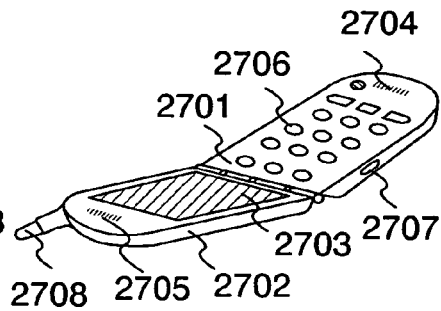

FIG. 11H shows a cellular phone, which includes a main body 2701, a casing 2702, a display portion 2703, an audio input portion 2704, an audio output portion 2705, an operation key 2706, an antenna 2708, and the like. The invention can be applied to a semiconductor integrated circuit (a memory, a CPU, or the like) embedded in a cellular phone and the display portion 2703. Thus, a cellular phone with a small integrated circuit can be realized by using the present invention.

Figure 12:
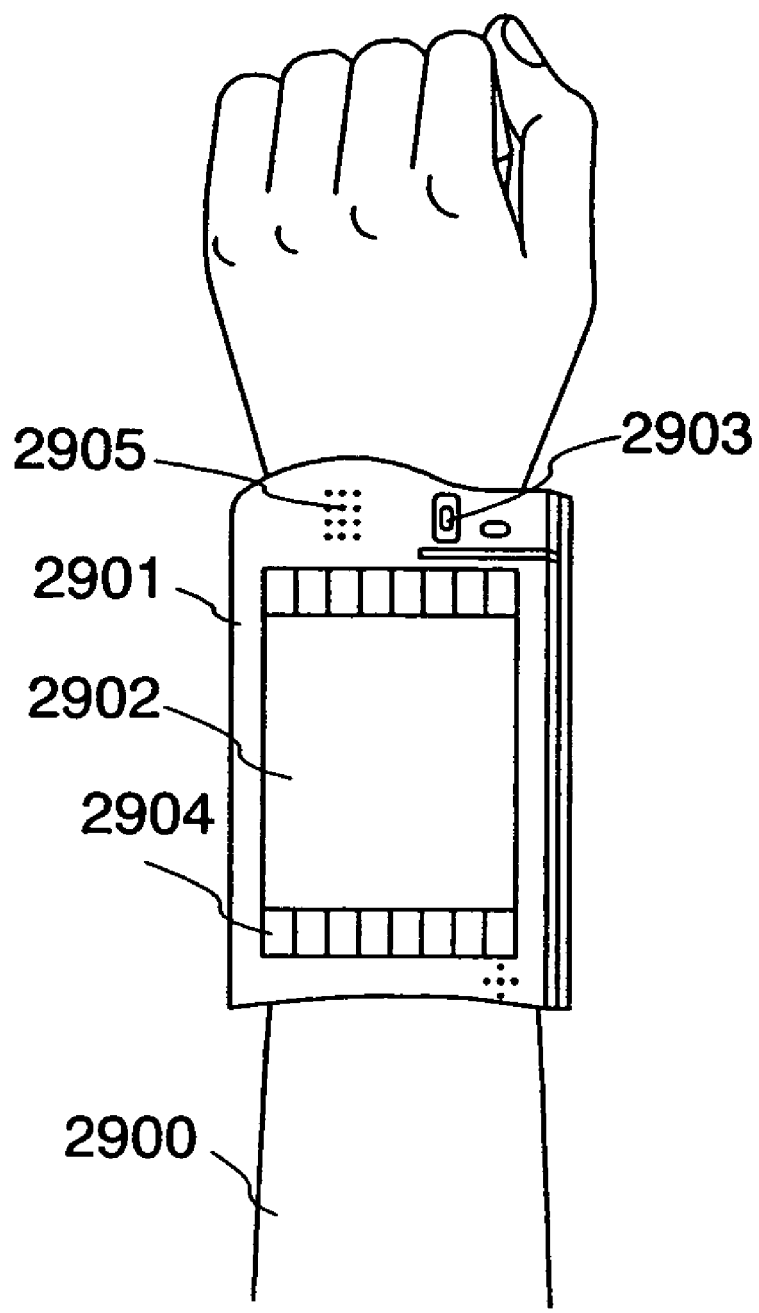
FIG. 12 is an example of an electronic device.
Figure 13A:
FIGS. 13A to 13C are diagrams showing examples of a cross-sectional shapes of gate electrodes according to the present invention.
Figure 13B:
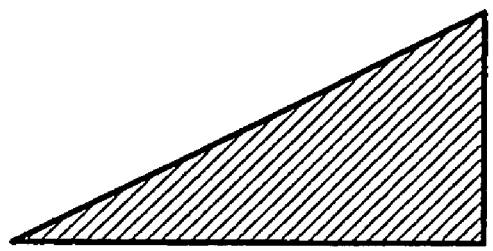
Figure 13C:
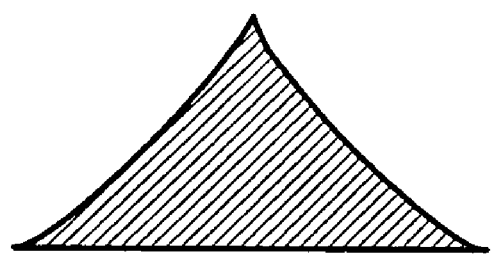

FIG. 12 shows a portable computer which can be worn around an arm, which includes a main body 2901, a display portion 2902, a switch 2903, an operation key 2904, a speaker portion 2905, and the like. Various input or operation can be performed by the display portion 2902 which serves as a touch panel. Further, although not shown here, this portable computer is provided with a cooling function for suppressing the increase of its temperature, an infrared port, a communication function such as a high-frequency circuit, and the like.

A portion of touching a human arm is preferably covered with a film such as a plastic so as not to feel discomfort for a human even when it touches the human arm 2900. Accordingly, it is desirable to form a semiconductor integrated circuit (a memory, a CPU, or the like) and the display portion 2902 over a plastic substrate. Further, an external shape of the main body 2901 may be curved along the human arm 2900.

The invention can be applied to a semiconductor integrated circuit (a memory, a CPU, a high-frequency circuit, or the like) embedded in a portable computer, the display portion 2902, a control circuit of the speaker portion 2905, and the like. Thus, a portable computer in which the number of mounted components is reduced can be realized.

This embodiment can be freely combined with any structure of Embodiment Modes 1 to 3 and Embodiments 1 and 3.

According to the invention, the line width of a gate electrode can be made to be minute and a TFT having a thin channel length can be obtained in a comparatively small number of steps, and thus, a manufacturing cost can be reduced. Further, part of circuits of a semiconductor integrated circuit can be a circuit which operates at high speed (typically, a CMOS circuit or a NMOS circuit) without increasing the number of masks.

This application is based on Japanese Patent Application serial No. 2004-152433 field in Japan Patent Office on May 21$^{st}$, 2004, the contents of which are hereby incorporated by reference.

What is claimed is:

1. A semiconductor device comprising:
   a plurality of TFTs each including a semiconductor layer formed over an insulating surface, an insulating film formed over the semiconductor layer, and a gate electrode farmed over the insulating film,
   wherein the semiconductor layer has a channel formation region overlapped with the gate electrode a low-concentration impurity region partly overlapped with the gate electrode and a high-concentration impurity region, and
   wherein a part of the gate electrode overlapping with the channel formation region has a cross-sectional shape comprising only three interior angles.

2. The semiconductor device according to claim 1, wherein a channel length of each of the plurality of TFTs is from 0.1 μm to 1 μm.

3. The semiconductor device according to claim 1, wherein the gate electrode diverges from a gate wiring, and the gate wiring is wider than the gate electrode.

4. The semiconductor device according to claim 1, wherein each of a side surface and a lower surface of the gate electrode contacts with a silicon nitride film.

5. The semiconductor device according to claim 1, wherein the gate electrode includes a refractory metal.

6. The semiconductor device according to claim 1, wherein the semiconductor device is a liquid crystal display device.

7. The semiconductor device according to claim 1, wherein the semiconductor device is an EL light emitting device.

8. The semiconductor device according to claim 1, wherein the semiconductor device is a camera such as a video camera or a digital camera, a projector, a goggle type display, a navigation system, a personal computer, a personal digital assistant, or an amusement device.

9. A semiconductor device comprising:
   a plurality of TETs each including a semiconductor layer formed over an insulating surface, an insulating film formed over the semiconductor layer, and a gate electrode formed over the insulating film,
   wherein a part of the gate electrode overlapping the semiconductor layer has a cross sectional shape comprising only three interior angles, and
   wherein a gate wiring formed to be connected to the gate electrode has a cross section of a trapezoidal shape.

10. The semiconductor device according to claim 9, wherein a channel length of each of the plurality of TETs is from 0.1 μm to 1 μm.

11. The semiconductor device according to claim 9, wherein the gate electrode diverges from the gate wiring, and the gate wiring is wider than the gate electrode.

12. The semiconductor device according to claim 9, wherein each of a side surface and a lower surface of the gate electrode contacts with a silicon nitride film.

13. The semiconductor device according to claim 9, wherein the gate electrode includes a refractory metal.

14. The semiconductor device according to claim 9, wherein the semiconductor device is a liquid crystal display device.

15. The semiconductor device according to claim 9, wherein the semiconductor device is an EL light emitting device.

16. The semiconductor device according to claim 9, wherein the semiconductor device is a camera such as a video camera or a digital camera, a projector, a goggle type display, a navigation system, a personal computer, a personal digital assistant, or an electronic amusement device.

17. A semiconductor device comprising:
    a plurality of TETs each including a semiconductor layer formed over an insulating surface, an insulating film formed over the semiconductor layer, and a plurality of gate electrodes formed over the insulating film,
    wherein the semiconductor layer has a plurality of channel formation regions each overlapped with one of the plurality of gate electrodes,
    wherein a part of each of the plurality of gate electrodes overlapping the semiconductor layer has a cross sectional shape comprising only three interior angles, and
    wherein a gate wiring formed to be connected to the plurality of gate electrodes has a section having a trapezoidal shape.

18. The semiconductor device according to claim 17, wherein a channel length of each of the plurality of TFTs is from 0.1 μm to 1 μm.

19. The semiconductor device according to claim 17, wherein the gate electrode diverges from the gate wiring, and the gate wiring is wider than the gate electrode.

20. The semiconductor device according to claim 17, wherein each of side surface and a lower surface of the gate electrode contacts with a silicon nitride film.

21. The semiconductor device according to claim 17, wherein the gate electrode includes a refractory metal.

22. The semiconductor device according to claim 17, wherein the semiconductor device is a liquid crystal display device.

23. The semiconductor device according to claim 17, wherein the semiconductor device is an EL light emitting device.

24. The semiconductor device according to claim 17, wherein the semiconductor device is a camera such as a video camera or a digital camera, a projector, a goggle type display, a navigation system, a personal computer, a personal digital assistant, or an electronic amusement device.

* * * * *